(12) United States Patent
Ma et al.

(10) Patent No.: US 12,320,830 B2
(45) Date of Patent: Jun. 3, 2025

(54) METHOD, DEVICE AND SYSTEM FOR MEASURING FREQUENCY DOMAIN CHARACTERISTICS, AND STORAGE MEDIUM

(71) Applicant: CHANGXIN MEMORY TECHNOLOGIES, INC., Hefei (CN)

(72) Inventors: Maosong Ma, Hefei (CN); Yaqi Fang, Hefei (CN); Jianbin Liu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 169 days.

(21) Appl. No.: 18/164,095

(22) Filed: Feb. 3, 2023

(65) Prior Publication Data

US 2023/0341447 A1 Oct. 26, 2023

Related U.S. Application Data

(63) Continuation of application No. PCT/CN2022/092923, filed on May 16, 2022.

(30) Foreign Application Priority Data

Apr. 22, 2022 (CN) .................. 202210431068.X

(51) Int. Cl.
*G01R 23/00* (2006.01)
*G01R 19/00* (2006.01)
(Continued)

(52) U.S. Cl.
CPC ........ *G01R 23/005* (2013.01); *G01R 19/0038* (2013.01); *G01R 23/06* (2013.01);
(Continued)

(58) Field of Classification Search
None
See application file for complete search history.

(56) References Cited

U.S. PATENT DOCUMENTS 9,098,671 B2 * 8/2015 Ding .................. G06F 30/367
9,183,345 B2 * 11/2015 Lin .................... G06F 30/394
(Continued)

FOREIGN PATENT DOCUMENTS

CN 101788604 A 7/2010
CN 106093567 A 11/2016
(Continued)

*Primary Examiner* — Jermele M Hollington
(74) *Attorney, Agent, or Firm* — Syncoda LLC; Feng Ma

(57) ABSTRACT

A method for measuring frequency domain characteristics of a PDN having an output terminal connected to a power supply end of a functional circuit. The method includes: a to-be-measured output interface of the functional circuit is acquired; the to-be-measured output interface is controlled to output a first level signal having a first preset rule; remaining at least one output interface of the functional circuit, other than the to-be-measured output interface, is controlled to output a second level signal having a second preset rule according to a first frequency; changing voltage values corresponding to the first frequency and output by the to-be-measured output interface are acquired; and a characteristic impedance of the PDN at the first frequency is determined based on the changing voltage values corresponding to the first frequency.

14 Claims, 11 Drawing Sheets

(51) Int. Cl.
   *G01R 23/06*      (2006.01)
   *G01R 31/28*      (2006.01)
   *G01R 31/3183*    (2006.01)

(52) U.S. Cl.
   CPC ..... *G01R 31/2801* (2013.01); *G01R 31/2851* (2013.01); *G01R 31/318307* (2013.01)

(56) References Cited

U.S. PATENT DOCUMENTS

| | | | |
|---|---|---|---|
| 9,596,037 | B2 | 3/2017 | Hsueh |
| 10,922,940 | B1 | 2/2021 | Chin |
| 2018/0284867 | A1* | 10/2018 | YangGong ............ G06F 1/3206 |

FOREIGN PATENT DOCUMENTS

| | | |
|---|---|---|
| CN | 110781642 A | 2/2020 |
| CN | 111209654 A | 5/2020 |

* cited by examiner

METHOD, DEVICE AND SYSTEM FOR MEASURING FREQUENCY DOMAIN CHARACTERISTICS, AND STORAGE MEDIUM

CROSS-REFERENCE TO RELATED APPLICATIONS

This application is a continuation of International Application No. PCT/CN2022/092923, filed on May 16, 2022, which claims priority to Chinese Patent Application No. 202210431068.X, filed on Apr. 22, 2022. The disclosures of International Application No. PCT/CN2022/092923 and Chinese Patent Application No. 202210431068.X are hereby incorporated by reference in their entireties.

BACKGROUND

The normal operation of a chip requires a power supply. Some chips include Power Delivery Networks (PDNs) and functional circuits, and the functional circuits are supplied by the PDNs. The PDN is very important to the operation stability of a chip, so it is necessary to measure the frequency domain characteristics of the PDN. In practical applications, the PDN of a chip usually includes the whole path from the power supply circuit to a power input terminal of the functional circuit. However, because the circuits inside the chip are too fine, almost no instrument can truly measure the frequency domain characteristics of the PDN.

In related art, modeling and simulation is often used to obtain the frequency domain characteristics of the PDN, but such a manner cannot truly reflect the frequency domain characteristics of the PDN. Therefore, it is urgent to provide a measurement method that can relatively truly reflect the frequency domain characteristics of the PDN.

SUMMARY

The present disclosure relates to the technical field of semiconductors, in particular to a method, a device, a system and a storage medium for measuring frequency domain characteristics of a Power Delivery Network (PDN).

In view of above, embodiments of the present disclosure desires to provide a method, a device, a system and a storage medium for measuring the frequency domain characteristics of a PDN.

The technical solution of the embodiments of the present disclosure is implemented as follows.

The embodiments of the present disclosure provides method for measuring frequency domain characteristics of a Power Delivery Network (PDN) having an output terminal connected to a power supply end of a functional circuit, the method includes the following operations: acquiring a to-be-measured output interface of the functional circuit; controlling the to-be-measured output interface to output a first level signal having a first preset rule; controlling remaining at least one output interface of the functional circuit, other than the to-be-measured output interface, to output a second level signal having a second preset rule according to a first frequency; acquiring changing voltage values corresponding to the first frequency and output by the to-be-measured output interface; and determining a characteristic impedance of the PDN at the first frequency based on the changing voltage values corresponding to the first frequency.

The embodiments of the present disclosure also provide a device for measuring frequency domain characteristics of a Power Delivery Network (PDN) having an output terminal connected to a power supply end of a functional circuit, the device includes: a memory storing processor-executable instructions; and a processor. The processer is configured to execute the stored processor-executable instructions to perform an operation of: acquiring a to-be-measured output interface of the functional circuit; controlling the to-be-measured output interface to output a first level signal having a first preset rule; controlling remaining at least one output interface of the functional circuit, other than the to-be-measured output interface, to output a second level signal having a second preset rule according to a first frequency; acquiring changing voltage values corresponding to the first frequency and output by the to-be-measured output interface; and determining a characteristic impedance of the PDN at the first frequency based on the changing voltage values corresponding to the first frequency.

The embodiments of the present disclosure also provide a system for measuring frequency domain characteristics of a PDN. The system includes a chip, a control circuit, a detection circuit and an analysis circuit. The chip includes the PDN and a functional circuit, an output terminal of the PDN being connected to a power supply end of the functional circuit, and the PDN being configured to supply power to the functional circuit. The detection circuit is configured to acquire a to-be-measured output interface of the functional circuit. The control circuit is respectively connected to the PDN and the detection circuit, and configured to control the to-be-measured output interface to output a first level signal having a first preset rule and control remaining at least one output interface of the functional circuit, other than the to-be-measured output interface, to output a second level signal having a second preset rule according to a first frequency. The detection circuit is connected to the to-be-measured output interface of the functional circuit and the analysis circuit, and configured to acquire changing voltage values corresponding to the first frequency and output by the to-be-measured output interface and transmit the changing voltage values corresponding to the first frequency to the analysis circuit. The analysis circuit is configured to determine a characteristic impedance of the PDN at the first frequency based on the changing voltage values corresponding to the first frequency.

It should be emphasized that the PDN in the present disclosure is packaged inside the chip, and the level signal output by an output terminal of the chip is generated and controlled by the PDN itself. The measurement of the present disclosure focus on the frequency domain characteristics of the PDN disposed inside the memory or other packaged chips.

DETAILED DESCRIPTION

In order that the above objects, features and advantages of the embodiments of the present disclosure may be more readily understood, the technical solutions in the embodiments of the present disclosure will be clearly and completely described in conjunction with drawings in the embodiments of the present disclosure. It is apparent that the described embodiments are only a portion of the embodiments of the present disclosure and not all embodiments.

Some chips include a PDN and a functional circuit. The functional circuit is supplied by the PDN; and the PDN can be understood as a sum of power supply parts in the chip, and configured to provide all the voltages required by the power supply circuit. Generally speaking, there is only one PDN in one chip, because the PDN per se is a collection of power supply paths. Generally, the PDN can include power management integrated circuit (PMIC), namely power supply circuit, PCB power planes, package power planes, and power processing sub-circuits at the power supply end of the functional circuit, such as an on-die capacitor. Each part of the PDN above can be abstracted into the most basic R/L/C model, so as to model the whole PDN in terms of the frequency domain characteristics.

Figure 1:
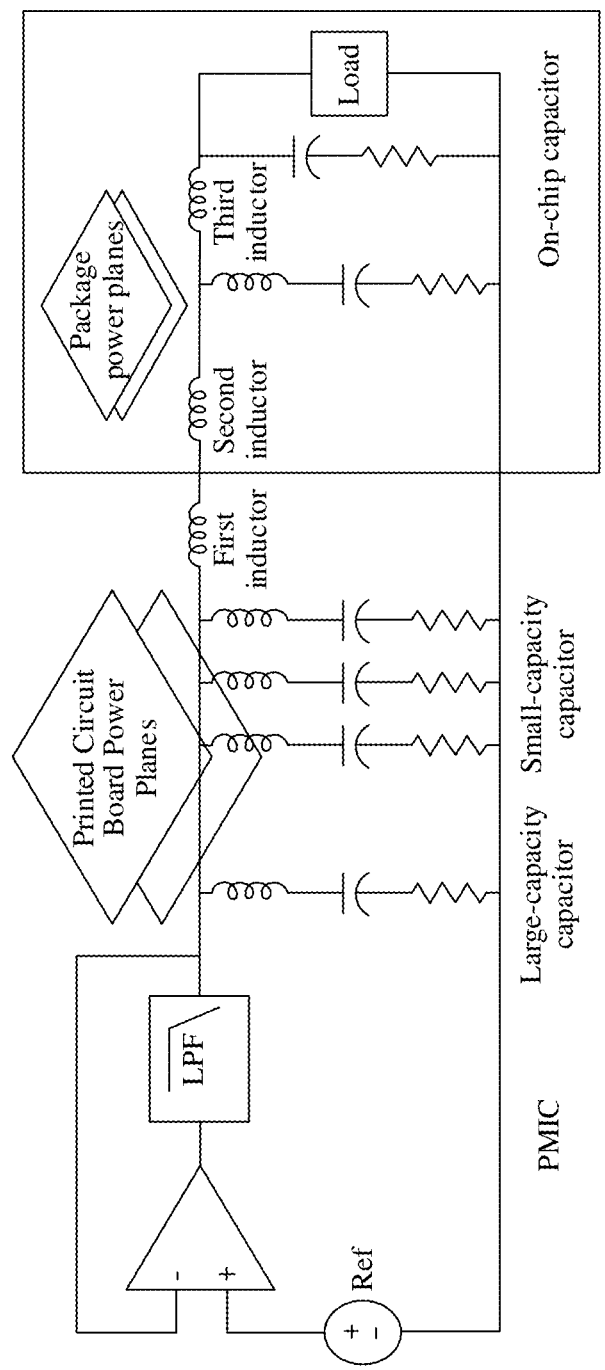
FIG. 1 is a schematic diagram of a basic resistance/inductance/capacitance (R/L/C) model of a PDN according to an embodiment of the present disclosure.

As shown in FIG. 1, the PDN of the chip is equivalent to: a voltage reference equivalently formed by the PMIC, a low-pass filter (LPF), a large-capacity capacitor (such as an electrolytic capacitor) equivalently formed by the PCB power planes, a small-capacity capacitor (such as a ceramic capacitor), a first inductor equivalently formed between each PCB plane and a respective via, a second inductor equivalently formed between a via and solder balls in the package power planes, a third inductor formed equivalently by solder bumps, and a decoupling capacitor (on-chip capacitor) at the power supply end of the functional circuit.

Figure 2:
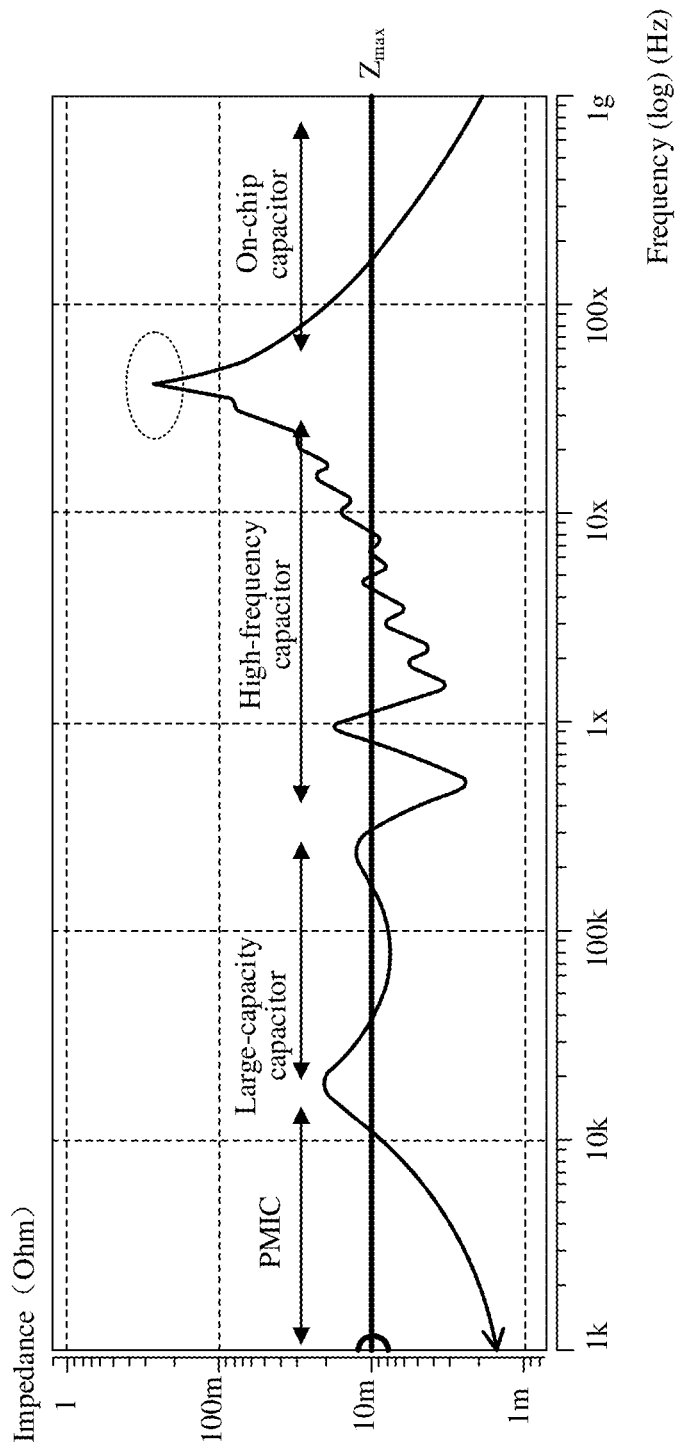
FIG. 2 is a schematic diagram of a frequency domain impedance curve corresponding to each part of the model of the PDN according to an embodiment of the present disclosure.

Due to the influence of parasitic inductance (such as from the first inductance to the third inductance mentioned above), the characteristic impedance of the PDN is usually large at high frequency. The arrangement of the decoupling capacitor can eliminate the influence of parasitic inductance to a certain extent. However, the capacitance value of the decoupling capacitor of the chip is limited, so it is usually difficult to remove the influence of parasitic inductance. Therefore, from the chip side, the impedance curve of the PDN will have a peak value, e.g., a PDN resonance point shown by dashed circle in FIG. 2. Zmax in FIG. 2 is a reference impedance. In some specific examples, the reference impedance can be calculated according to the following formula:

$$Z\max = \frac{Vdd \times \text{tolerance}}{I\max - I\min} = \frac{1.2V \times 0.05}{7A - 2A} = 10 \text{ mohm}$$

That is to say, what is shown in FIG. 2 is that when there is no parasitic inductance, the impedances of the PDN at different operating frequencies are always the reference impedance theoretically. However, when parasitic inductance exists in practical applications, the impedance will change at different operating frequencies. At a low frequency, the influence of parasitic inductance can be removed by using a large-capacity capacitor. Then, with the increase of the frequency, the influence of the parasitic inductance can be removed (shown as the impedance being near the reference impedance) by using a high-frequency capacitor; and then since the capacitance value of the decoupling capacitor on the chip is limited, and the influence of parasitic inductance cannot be removed (shown as the impedance in some frequency regions being larger than the reference impedance) in some frequency regions.

Figure 3:
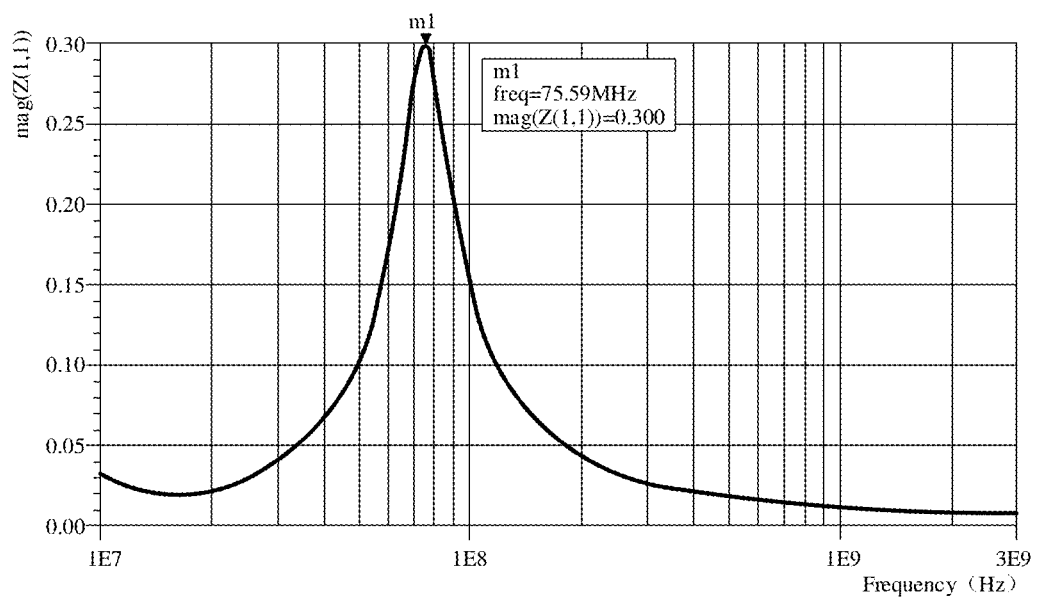
FIG. 3 is an example diagram of a frequency domain impedance curve of a PDN obtained by simulation according to an embodiment of the present disclosure.

In practical applications, because the circuits inside the chip are too fine, almost no instrument can truly measure the frequency domain characteristics of the PDN of the chip. In related art, the characteristic impedance of the PDN of the chip is generally obtained by simulation. Specifically, the R/L/C models of the PMIC, the PCB power planes and the package power planes are extracted by simulation, and the frequency domain impedance curve of the PDN is obtained by the simulation combined with the value of the on-chip capacitor. In practical applications, an example diagram of a frequency domain impedance curve of a PDN obtained by simulation is shown in FIG. 3. However, the frequency domain impedance curve obtained by simulation lacks consideration of the real circuit environment, and cannot truly reflect the frequency domain characteristics of the PDN.

In order to solve the above problem, the embodiments of the present disclosure provide a method, device and system for measuring frequency domain characteristics of a PDN, and a storage medium. In each embodiment of the present disclosure, based on the real circuit of the PDN and the chip, the characteristic impedance of the PDN at a specific frequency is determined by detecting the changing voltage values output by the to-be-measured output interface of the functional circuit at a specific frequency. In each embodiment of the present disclosure, the characteristic impedance at specific frequency is acquired based on the real circuit measurement, which can relatively truly reflect the frequency domain characteristics of the PDN.

Figure 4:
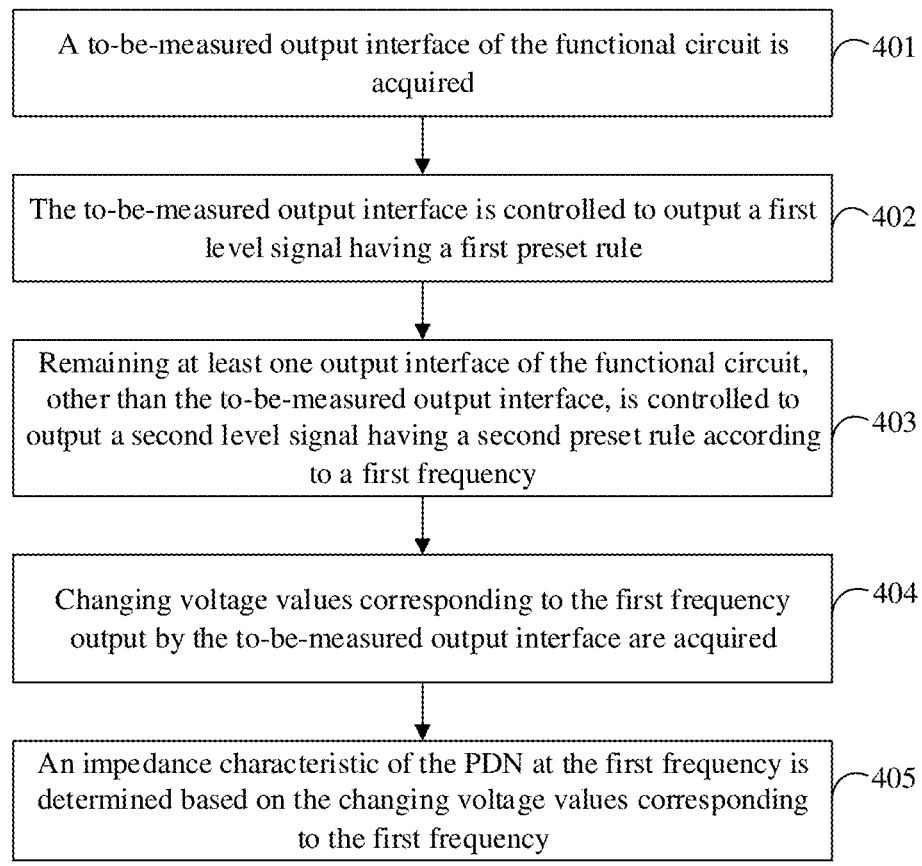
FIG. 4 is an implementation flowchart of a method for measuring frequency domain characteristics of a PDN according to an embodiment of the present disclosure.

The embodiment of the present disclosure provides a method for measuring frequency domain characteristic of a PDN. FIG. 4 is an implementation flowchart of the method for measuring frequency domain characteristics of a PDN according to an embodiment of the present disclosure. As shown in FIG. 4, the method includes operations 401 to 405.

In operation 401, a to-be-measured output interface of the functional circuit is acquired.

In operation 402, the to-be-measured output interface is controlled to output a first level signal having a first preset rule.

In operation 403, remaining at least one output interface of the functional circuit, other than the to-be-measured output interface, is controlled to output a second level signal having a second preset rule according to a first frequency.

In operation 404, changing voltage values corresponding to the first frequency and output by the to-be-measured output interface are acquired.

In operation 405, a characteristic impedance of the PDN at the first frequency is determined based on the changing voltage values corresponding to the first frequency.

In practical applications, one chip is configured with one PDN, where the PDN can be understood as a sum of power supply parts in the chip, and configured to provide all the voltages required by the functional circuit. One PDN can provide one voltage or several different voltages. For example, if the functional circuit of a chip requires two different voltages having values of 3.3 V and 1.8 V, the PDN of the chip can provide two different voltages having values of 3.3 V and 1.8 V The PDN of the chip usually includes the whole path from the power supply circuit to the power input terminal of the functional circuit. In some embodiments, the PDN includes at least the PMIC, the PCB power planes, package power planes, and the power processing sub-circuit at the power supply end of the functional circuit. Herein, the power processing sub-circuit at the power supply end of the functional circuit may include the on-chip capacitor or the like disposed at the power supply end of the functional circuit in a chip.

Herein, the chip may include the PDN and the functional circuit, and the output terminal of the PDN is connected with the power supply end of the functional circuit. In some specific examples, the chip may include a dynamic random access memory.

The embodiment of the present disclosure provides a method for measuring frequency domain characteristics of a PDN of the chip according to the characteristics of the PDN inside the chip and the output interface of the chip.

In operation 401, the functional circuit of the chip may include multiple output interfaces. In practical applications, the output interface can be an Input/Output (I/O) pin of the chip or a test solder joint connected with the I/O pin of the chip. Usually, the PDN will supply power to multiple I/O pins of the chip simultaneously.

Figure 5:
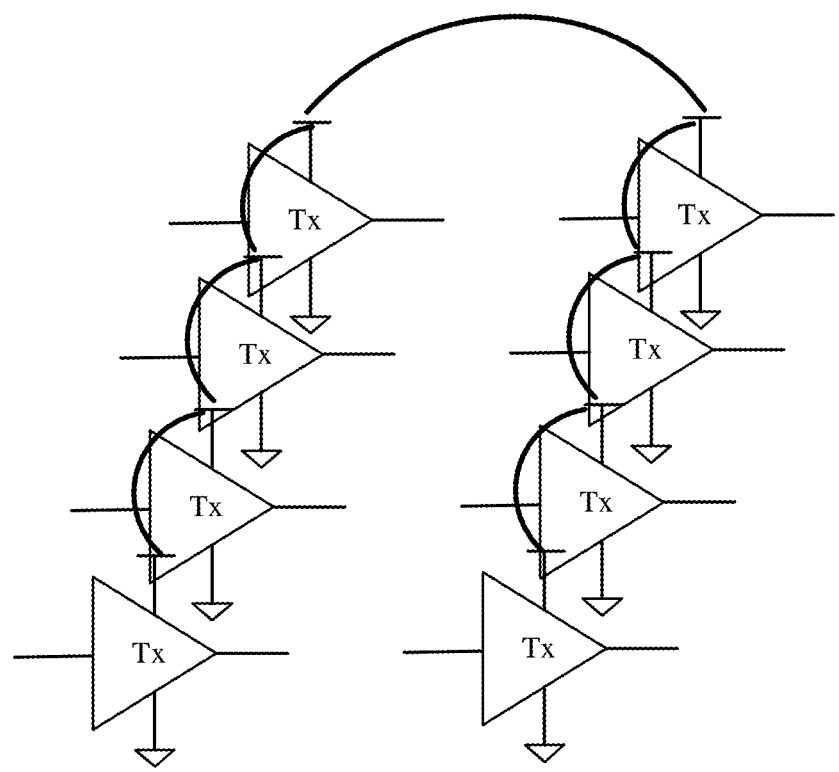
FIG. 5 is a schematic diagram showing a relationship between some output interfaces of the chip and a PDN according to an embodiment of the present disclosure.

FIG. 5 is a schematic diagram showing the relationship between some output interfaces of the chip and the PDN according to an embodiment of the present disclosure. As shown in FIG. 5, the I/O pins consume power when there is a signal output, and draw current from the PDN.

Herein, the to-be-measured output interface includes any one of the multiple output interfaces supplied by the PDN.

In practical applications, the to-be-measured output interface of the functional circuit is acquired in a manner of receiving information, and the received information indicates that any one of the output interfaces (an I/O pin with any number and supplied by the PDN) is randomly selected as the to-be-measured output interface, or a certain output interface (an I/O pin with a specific number and supplied by the PDN) is specified to be the to-be-measured output interface.

In operation 402, the controlled object is the aforementioned to-be-measured output interface.

Herein, the first preset rule may include constant generation of a certain level signal. In some embodiments, the first level signal having the first preset rule represents a level signal whose signal value is constant at the first level. In some embodiments, a voltage corresponding to the first level is substantially identical to a voltage provided by the PDN to the functional circuit, i.e., a high level.

That is to say, in practical applications, any I/O pin can be selected, from among N I/O pins supplied by the same PDN, as the to-be-measured output interface, and the selected I/O pin can be controlled to output a high level ("1") all the time. In this case, it can be regarded that the selected I/O is short-circuited with the PDN, so that the selected I/O pin always outputs the voltage provided by the PDN to the functional circuit.

Herein, the expression "substantially identical" can be understood as there being a small difference between the voltage corresponding to the first level and the voltage provided by the PDN, where the small difference can be a small voltage drop or measurement error brought by the line.

In operation 403, the controlled object is remaining at least one output interface of the chip, other than the to-be-measured output interface, and both the at least one output interface and the to-be-measured output interface are supplied by the PDN. It should be noted that the number of the remaining at least one output interface may be multiple, and as the number increases, the higher the spectrum assignment of a particular I/O pin, the more significant the noise phenomenon of the power supply. In practical applications, the remaining N−1 I/O pins, other than the I/O pin selected as the to-be-measured output interface, can be selected, among the N I/O pins supplied by the same PDN, as the controlled object in operation 403.

In some embodiments, the second level signal having the second preset rule represents a level signal whose signal value has the first level and a second level with a preset duty ratio. In other embodiments, the second preset rule includes randomly generating level signals, each of the randomly generated level signals may have the first level or the second level. The first level is greater than the second level, the first level is a high level, and the second level is a low level. In addition, the above-mentioned "preset duty ratio" can be a fixed value or a random value.

In some embodiments, the preset duty ratio is 50%. For example, changing clock signal "010101 . . . " is output.

In other embodiments, the preset duty ratio may be any other stable value. For example, changing clock signal "001001001 . . . " or "000100010001 . . . " is output.

It should be noted that in the embodiments of the present disclosure, any signal can be the second level signal having the second preset rule as long as it has a stable duty ratio, but when the preset duty ratio is 50%, the calculation is more convenient and concise, and the noise phenomenon of the power supply is more significant. In practical applications, a variety of clock signals with different duty ratios and amplitudes can be used for measuring, which will be described in detail later.

Herein, the first frequency has a fixed frequency value. In practical applications, the output frequency of the second level signal can be adjusted according to the frequency of the Clock Pulse (CP) so as to implement the frequency adjustment.

In practical applications, the control in operations 402 and 403 can be implemented by using a control circuit having the pin control function of the chip. The control circuit herein includes but is not limited to a Field Programmable Gate Array (FPGA) test development board.

In operation 404, the output values of the to-be-measured output interface over a period of time, i.e. the changing voltage values, are measured, thereby determining the influence on the to-be-measured output interface by other output interfaces.

It can be understood that when the to-be-measured output interface is controlled to output high level all the time, if the influence from other output interfaces is not considered, the output values of the to-be-measured output interface within the period of time are approaching the voltage provided by the PDN to the chip. At this time, when the other at least one output interface is simultaneously controlled to output the clock signal with alternating high level and low level, the power supply noise with the same frequency as the alternating high level and low level will also be generated on the PDN, and since the output signal of the to-be-measured output interface remains to be high level ("1"), the path from the to-be-measured output interface to the power supply is in a short circuit state at this time. Thus, the change of the power supply noise can be measured through the to-be-measured output interface.

In practical applications, the changing voltage values corresponding to the first frequency and output by the to-be-measured output interface can be acquired by using an oscilloscope or spectrum analyzer.

In operation 405, a characteristic impedance of the PDN at the first frequency is determined based on the changing voltage values corresponding to the first frequency.

In some embodiments, the operation of determining the characteristic impedance of the PDN at the first frequency based on the changing voltage values corresponding to the first frequency includes:
    a power supply noise value corresponding to the first frequency is determined based on the changing voltage values corresponding to the first frequency; and
    the characteristic impedance of the PDN at the first frequency is determined based on the power supply noise value corresponding to the first frequency.

Herein, the power source noise value may be a maximum value of a difference between a present voltage value, among the changing voltage values corresponding to the first frequency, and a present desired voltage value, the present desired voltage value varies as the level changes, and the desired voltage value may be considered as the maximum voltage value of the corresponding level; or, the power source noise value may be the difference between the maximum voltage value and the minimum voltage value.

In some embodiments, the operation of determining the characteristic impedance of the PDN at the first frequency based on the power supply noise value corresponding to the first frequency includes:
    a current value corresponding to the first frequency at the remaining at least one output interface is acquired; and
    a quotient of the power supply noise value corresponding to the first frequency and the current value corresponding to the first frequency is determined as the characteristic impedance at the first frequency.

Herein, the current value refers to a value of a working current provided by the PDN to the remaining at least one output interface (a number N−1 of I/O pins) of the chip other than the to-be-measured output interface, and the current value is the sum of the output currents of N−1 I/O pins. It should be noted that the current value is not a fixed value, but related to the output level. For example, the current value drawn when a low level is output is relatively small, and the current value drawn when a high level is output is relatively large.

In practical applications, the current value can be obtained by measuring the current on the load at the N−1 I/O pins. The specific manner for measuring the current can be the measurement of the voltage across the load and the resistance of the load.

Herein, the characteristic impedance of the PDN at the first frequency is acquired.

In practical applications, the characteristic impedance of the PDN at the first frequency can reflect at least part of the frequency domain characteristics of the PDN.

In practical applications, the second level signal can be a variety of clock signals with different duty ratios, so that each different duty ratio can be tested separately.

In some embodiments, the preset duty ratio includes multiple duty ratios.

The operation of acquiring the changing voltage values corresponding to the first frequency and output by the to-be-measured output interface includes:
    multiple groups of changing voltage values corresponding to the first frequency and output by the to-be-measured output interface are acquired, each of the multiple groups of changing voltage values corresponds to a respective one of the multiple different duty ratios.

The operation of determining the characteristic impedance of the PDN at the first frequency based on the changing voltage values corresponding to the first frequency includes:
    multiple preliminary characteristic impedances of the PDN at the first frequency are determined based on the multiple groups of changing voltage values corresponding to the first frequency, each preliminary characteristic impedance corresponds to a respective one of the plurality of duty ratios; and
    an average value of the multiple preliminary characteristic impedances corresponding to the first frequency is determined as the characteristic impedance of the PDN at the first frequency.

Herein, for each duty ratio, the method for determining the characteristic impedance is the same as the method for determining the characteristic impedance corresponding to the duty ratio of 50% described above. In practical applications, the acquired multiple initial characteristic impedances of the PDN at the first frequency, which are subjected to averaging or other processing, can be determined as the characteristic impedance of the PDN at the first frequency.

In practical applications, an output frequency range of the chip is wide, and the characteristic impedances of the PDN at other frequencies within the frequency range can be acquired according to the aforementioned method for acquiring the characteristic impedance of the PDN at the first frequency.

In some embodiments, the first preset frequency is a certain frequency within a preset frequency range. The method further includes:
    the remaining at least one output interface to output the second level signal is controlled according to each remaining frequency in a set of frequencies other than the first frequency, the set of frequencies comprise multiple frequencies within the preset frequency range;
    the changing voltage values corresponding to each remaining frequency output by the to-be-measured output interface are acquired; and
    the characteristic impedance of the PDN at each remaining frequency is determined based on the changing voltage values corresponding to each remaining frequency.

Herein, for each remaining frequency in a set of frequencies other than the first frequency, the method for determining the characteristic impedance is to the same as the method for determining the characteristic impedance corresponding to the first frequency. In practical applications, the general output frequency range of the chip is 50 MHz to 200 MHz, and the preset range can be a range covering the output frequency range of the chip. In some embodiments, the preset frequency range includes at least a range from 10 MHz to 1000 MHz.

In some embodiments, the method further includes:
a frequency domain characteristic curve of the PDN is determined based on the characteristic impedance of the PDN at the first frequency and the characteristic impedance of the PDN at each remaining frequency.

Herein, after the characteristic impedance of the PDN at the first frequency and the characteristic impedance of the PDN at each remaining frequency are acquired, the frequency domain characteristic curve of the PDN can be plotted from the characteristic impedances corresponding to the first frequency and each remaining frequency. It can be understood that the more the characteristic impedances of the remaining frequencies that are obtained, the more accurate and smooth the frequency domain characteristic curve of the PDN that is depicted.

In practical applications, after the frequency domain characteristic curve of PDN is acquired, the frequency domain characteristic curve of the PDN obtained by measurement can be compared with the simulated frequency domain characteristic curve of the PDN obtained by modeling and simulation, so as to evaluate the accuracy of the simulated frequency domain characteristic curve.

In some embodiments, the method further includes:
a simulated frequency domain characteristic curve of the PDN obtained by modeling and simulating the PDN is acquired; and
an accuracy of the simulated frequency domain characteristic curve is verified based on the simulated frequency domain characteristic curve and the frequency domain characteristic curve.

In practical applications, the frequency domain characteristic curve of PDN by measurement can also be used for guiding the model modification of PDN.

In the embodiments of the present disclosure, based on the real circuit of the chip, the characteristic impedance of the PDN at a specific frequency is determined by measuring the changing voltage values output by the to-be-measured output interface of the functional circuit at a specific frequency. In the embodiments of the present disclosure, the characteristic impedance at a specific frequency is acquired based on real circuit measurement, which can relatively truly reflect the frequency domain characteristics of the PDN.

The present disclosure is described in further detail below in connection with an application embodiment.

In order to measure the frequency domain characteristic impedance of a PDN, embodiments of the present disclosure are implemented by a particular I/O combination method, in particular, the method includes operations 1 to 3.

In operation 1, any one I/O pin (equivalent to the to-be-measured output interface mentioned above) among the N I/O pins supplied by a same PDN is selected, and the selected I/O pin outputs a high level all the time, that is, outputs a clock signal of "111111 . . ." (equivalent to the first level signal mentioned above).

In operation 2, the remaining N−1 pins (equivalent to the remaining at least one output interface other than the to-be-measured output interface) among the N I/O pins supplied by the same PDN, other than the selected I/O pin, simultaneously output a clock signal (equivalent to the aforementioned second level signal) of "010101 . . ." according to a fixed frequency.

Figure 6:
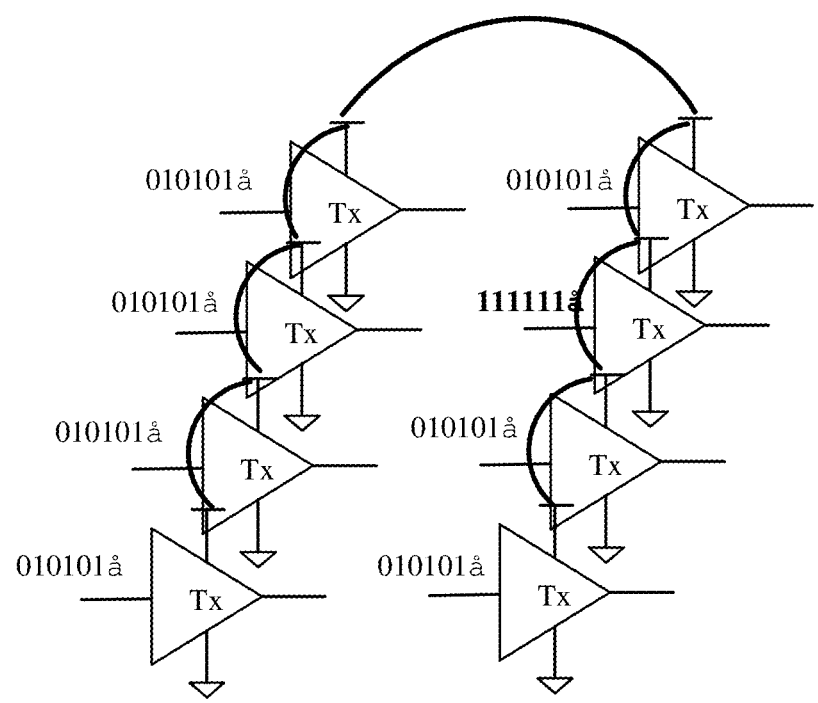
FIG. 6 is a schematic diagram of level signals output by some output interfaces of the chip according to an embodiment of the present disclosure.

Herein, the schematic diagram of the output signals of the I/O pins in operations 1 and 2 are shown in FIG. 6. It should be noted that the number of I/O pins shown in FIG. 6 does not represent the actual number used, and the value of N can be adjusted according to the actual situation.

In operation 3, the high level signal output from the selected I/O pin in operation 1 is measured by an oscilloscope or spectrum analyzer to calculate the power supply noise value at this time.

It can be understood that when the N−1 I/O pins in the above operation 2 simultaneously switch according to "010101 . . .", the power supply noise with the same frequency as the switching of the signals will also be generated on the PDN. The output signal of the selected I/O pin in the above operation 1 is continuously "1", and the path from the signal output pin to the PDN is in a short-circuited state at this time, so the change of the power supply noise can be measured through the signal output.

Figure 7:
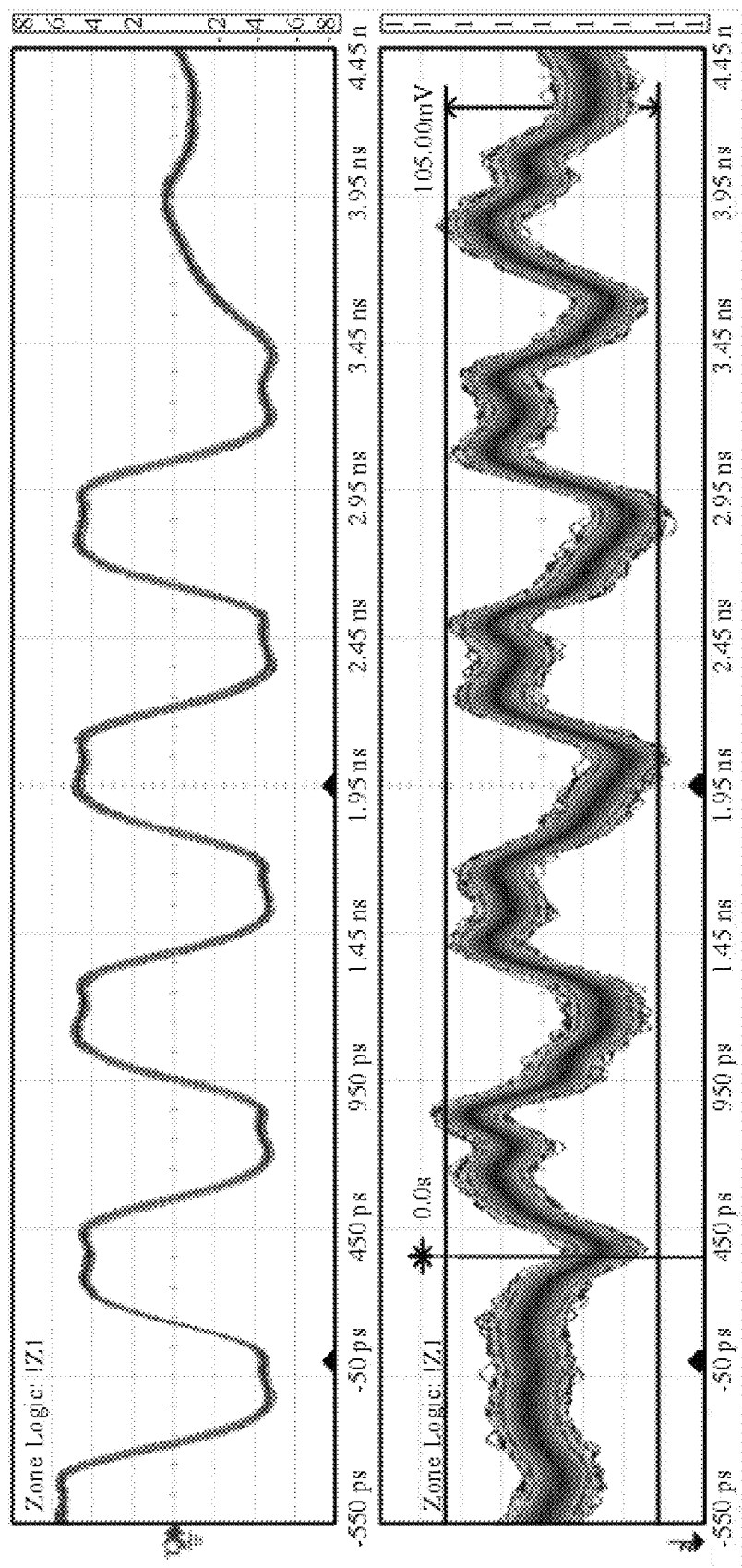
FIG. 7 is an example diagram of a power supply noise curve of a PDN at a specific frequency according to an embodiment of the present disclosure.

FIG. 7 is an example diagram of the power supply noise curve of a PDN at a specific frequency according to an embodiment of the present disclosure. The waveform diagram in the upper part of FIG. 7 shows the changing signals of "010101 . . ." output by N−1 I/O pins; the waveform diagram of the lower half of FIG. 7 is a waveform diagram of the power supply noise. As can be seen from FIG. 7, in this particular example, the power supply noise value is 105 mV.

In operation 4, operations 2 and 3 are repeated, and the frequency in operation2 is switched in each repetition, the range of the switched frequency can be selected from a range from 10 MHz to 1000 MHz.

In operation 5, the power supply noise values at different frequencies are recorded, and the power supply noise values are divided by the current consumed by switching of the N−1 I/O pins, so as to obtain the characteristic impedance of the PDN at different frequencies.

It can be understood that, operations 2 and 3 are repeated with signal "010101 . . ." switched to different frequencies, the power supply noise values at different frequencies are acquired. The power supply noise value is equal to the sum of the output currents of N−1 I/O pins, which are multiplied by the impedance value of the PDN at each frequency. By measuring the output of the selected I/O pin in operation 1 above, the power supply noise values at different frequencies can be acquired.

Figure 8A:
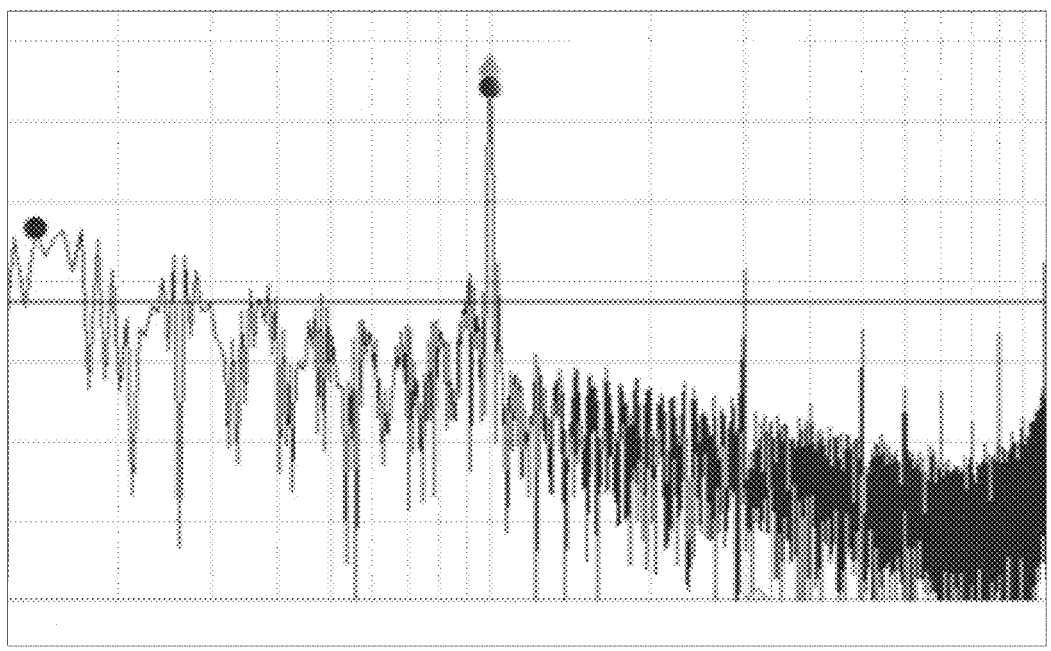
FIG. 8A is an example diagram of a power supply noise curve of a PDN at 100 MHz according to an embodiment of the present disclosure.
Figure 8B:
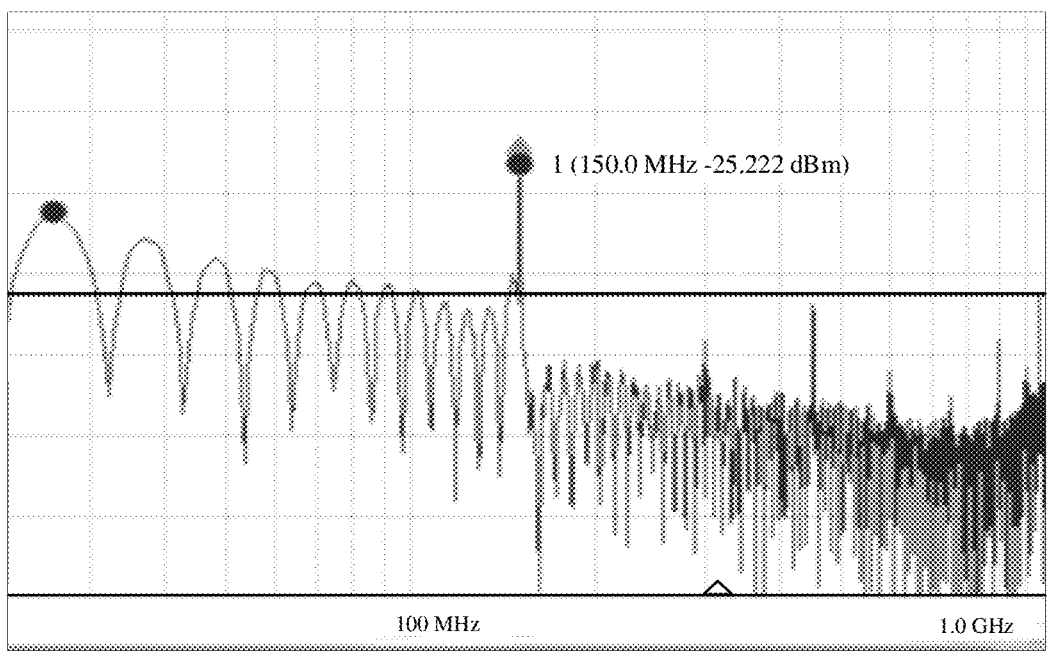
FIG. 8B is an example diagram of a power supply noise curve of a PDN at 150 MHz according to an embodiment of the present disclosure.

FIG. 8A is an example diagram of a power supply noise curve of a PDN at 100 MHz according to an embodiment of the present disclosure. FIG. 8B is an example diagram of a power supply noise curve of a PDN at 150 MHz according to an embodiment of the present disclosure.

It should be noted that the frequency of each diagram in FIG. 8A and FIG. 8B has a span, because even if the input frequency is specific, other frequency bands and corresponding noises will be generated due to the interaction between devices, but the noise value corresponding to the input frequency is still the largest.

Figure 9:
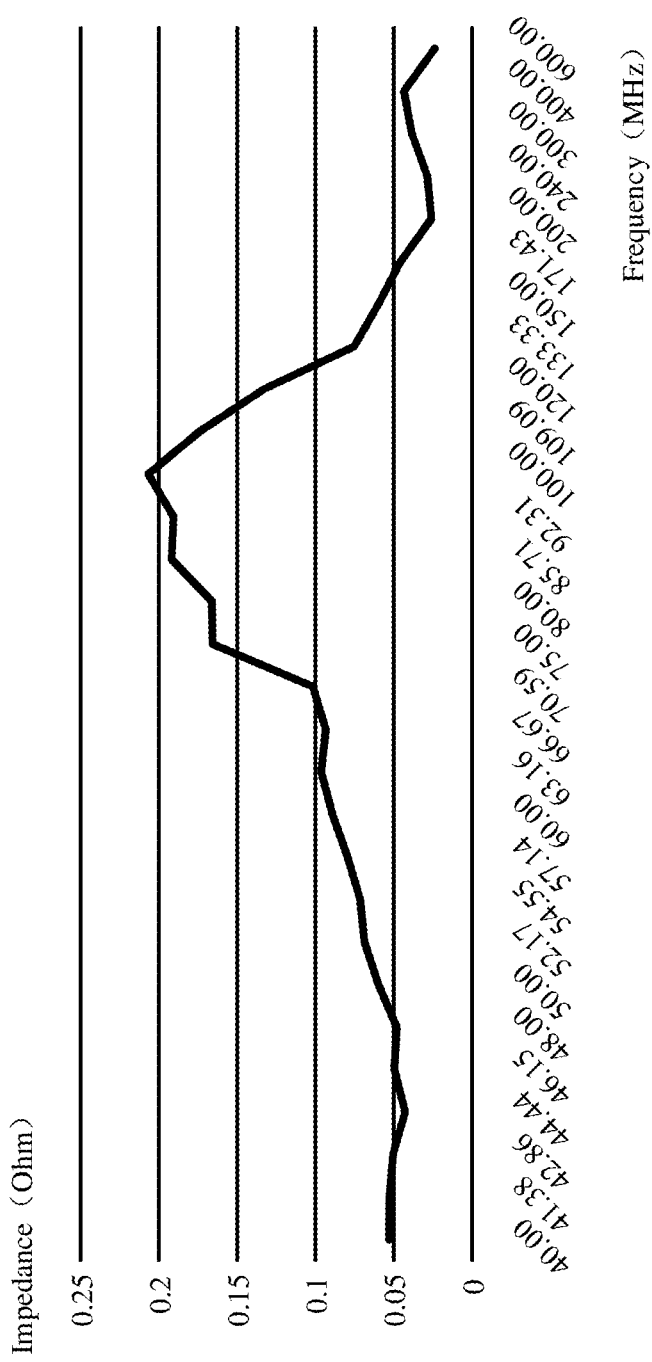
FIG. 9 is an example diagram of a frequency domain impedance curve of a PDN obtained by real measurement according to an embodiment of the present disclosure.

FIG. 9 is an example diagram of the frequency domain impedance curve of the PDN obtained by real measurement according to the embodiment of the present disclosure. With this method, the frequency domain characteristics of the PDN can be accurately measured and verified with the simulation result.

It should be noted that the embodiments of the present disclosure can be applied to various chips requiring frequency domain characteristic measurement. In some specific embodiments, the embodiments of the present disclosure can be applied to the measurement and verification of the frequency domain characteristics of dynamic random access memory, such as synchronous dynamic random access memory (SDRAM), and Double Data Rate (DDR) SDRAM.

In practical applications, FPGA memory can be used for measuring the development board to verify and measure the frequencies where the Synchronous Switching Noise (SSN) will generate of the dynamic random access memory.

Figure 10:
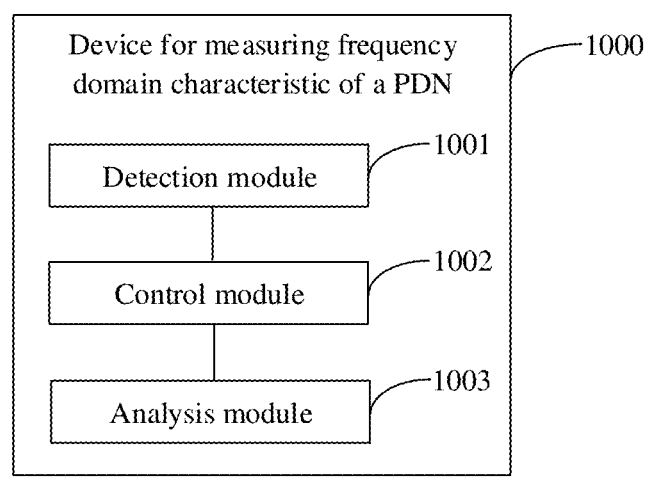
FIG. 10 is a schematic structural diagram of a device for measuring frequency domain characteristics of a PDN according to an embodiment of the present disclosure.

In order to implement the method of the embodiment of the present disclosure, the embodiment of the present disclosure also provides a device 1000 for measuring frequency domain characteristics of a PDN. FIG. 10 is a structural diagram of the device according to the embodiment of the present disclosure. As shown in FIG. 10, the device 1000 includes a detection module 1001, a control module 1002 and an analysis module 1003.

The detection module 1001 is configured to acquire a to-be-measured output interface of the functional circuit.

The control module 1002 is configured to control the to-be-measured output interface to output a first level signal having a first preset rule.

The control module 1002 is also configured to control remaining at least one output interface of the functional circuit, other than the to-be-measured output interface, to output a second level signal having a second preset rule according to a first frequency.

The detection module 1001 is further configured to acquire changing voltage values corresponding to the first frequency and output by the to-be-measured output interface.

The analysis module 1003 is configured to determine a characteristic impedance of the PDN at the first frequency based on the changing voltage values corresponding to the first frequency.

Herein, the output terminal of the PDN is connected to the power supply end of the functional circuit.

In some embodiments, the first level signal having the first preset rule represents a level signal whose signal value is constant at the first level.

The second level signal having the second preset rule represents a level signal whose signal value has the first level and a second level with a preset duty ratio.

The first level is greater than the second level.

In some embodiments, the voltage corresponding to the first level is substantially identical to a voltage provided by the PDN to the functional circuit.

In some embodiments, the preset duty ratio is 50%.

In some embodiments, the preset duty ratio includes multiple duty ratios.

The detection module 1001 is specifically configured to acquire multiple groups of changing voltage values corresponding to the first frequency and output by the to-be-measured output interface. Each of the multiple groups of changing voltage values corresponds to a respective one of the multiple of different duty ratios.

The analysis module 1003 is specifically configured to determine multiple preliminary characteristic impedances of the PDN at the first frequency based on the multiple groups of changing voltage values corresponding to the first frequency, each preliminary characteristic impedance corresponds to a respective one of the plurality of duty ratios; and determine an average value of the multiple preliminary characteristic impedances corresponding to the first frequency as the characteristic impedance of the PDN at the first frequency.

In some embodiments, the analysis module 1003 specifically configured to determine a power supply noise value corresponding to the first frequency based on the changing voltage values corresponding to the first frequency; and determine the characteristic impedance of the PDN at the first frequency based on the power supply noise value corresponding to the first frequency.

In some embodiments, the analysis module 1003 specifically configured to acquire a current value corresponding to the first frequency at the remaining at least one output interface; and determine, a quotient of the power supply noise value corresponding to the first frequency and the current value corresponding to the first frequency, as the characteristic impedance at the first frequency.

In some embodiments, the first preset frequency is a certain frequency within a preset frequency range.

The control module 1002 is further configured to control the remaining at least one output interface to output the second level signal according to each remaining frequency in a set of frequencies other than the first frequency. The set of frequencies comprise multiple frequencies within the preset frequency range.

The detection module 1001 is also configured to acquire the changing voltage values corresponding to each remaining frequency output by the to-be-measured output interface.

The analysis module 1003 is further configured to determine the characteristic impedance of the PDN at each remaining frequency based on the changing voltage values corresponding to each remaining frequency.

In some embodiments, the preset frequency range includes at least a range from 10 MHz to 1000 MHz.

In some embodiments, the Analysis Module 1003 is further configured to determine a frequency domain characteristic curve of the PDN based on the characteristic impedance of the PDN at the first frequency and the characteristic impedance of the PDN at each remaining frequency.

In some embodiments the detection module 1001 is configured to acquire a simulated frequency domain characteristic curve of the PDN obtained by modeling and simulating the PDN.

The device 1000 further includes a verification module.

The verification module is configured to verify verifying an accuracy of the simulated frequency domain characteristic curve based on the simulated frequency domain characteristic curve and the frequency domain characteristic curve.

In some embodiments, the PDN includes at least a power management integrated circuit, a printed circuit board power planes, a package power planes, and a power processing sub-circuit at the power supply end of the functional circuit.

In practical applications, the detection module 1001, the control module 1002, the analysis module 1003 and the verification module are implemented by the processor in the device 1000 for measuring frequency domain characteristics of the PDN.

It should be noted that, when the frequency domain characteristic measurement is performed by the method for measuring frequency domain characteristics of the PDN provided by the embodiments, only the division of the above-mentioned modules is used as an example for illustration. In practical applications, the processing can be assigned to different program modules according to requirements to be processed, that is, the internal structure of the device can be divided into different program modules to implement all or part of the processing described above. In addition, the device for measuring frequency domain characteristics of the PDN provided by the above embodiment and the method for measuring frequency domain characteristics of the PDN belong to the identical concept, and the specific implementation process is detailed in the method embodiments, which will not be described herein.

In order to implement the method of the embodiment of the present disclosure, the embodiment of the present disclosure also provides a system for measuring frequency domain characteristics of the PDN. The system includes a chip, a control circuit, a detection circuit and an analysis circuit.

The chip includes the PDN and a functional circuit, an output terminal of the PDN is connected to a power supply end of the functional circuit, and the PDN is configured to supply power to the functional circuit.

The detection circuit is configured to acquire a to-be-measured output interface of the functional circuit.

The control circuit is respectively connected to the PDN and the detection circuit, and configured to control the to-be-measured output interface to output a first level signal having a first preset rule and control remaining at least one output interface of the functional circuit, other than the to-be-measured output interface, to output a second level signal having a second preset rule according to a first frequency. Both the to-be-measured output interface and the at least one output interface are supplied by the PDN.

The detection circuit is connected to the to-be-measured output interface of the functional circuit and the analysis circuit, and configured to detect changing voltage values corresponding to the first frequency and output by the to-be-measured output interface and transmit the changing voltage values corresponding to the first frequency to the analysis circuit.

The analysis circuit is configured to determine a characteristic impedance of the PDN at the first frequency based on the changing voltage values corresponding to the first frequency.

Herein, the control circuit may include a device capable of implementing a function for controlling chip pins, and a device periphery. The control circuit includes but is not limited to a Field Programmable Gate Array (FPGA), a Digital Signal Processing (DSP), a Microcontroller Unit (MCU) and the like.

The detection circuit can include a self-built test circuit, and can also include existing measurement equipment such as oscilloscope or spectrum analyzer.

It should be noted that the system for measuring frequency domain characteristics of the PDN provided by the above embodiment and the method for measuring frequency domain characteristics of the PDN belong to the identical concept, and the specific implementation process is detailed in the method embodiments, which will not be described herein The embodiment of the present disclosure also provides a storage medium having stored thereon computer programs that, when executed by a processor, cause the processor to implement the operations in the method for measuring frequency domain characteristics of a PDN according to the embodiment of the present disclosure.

In some embodiments, the storage medium may be Ferromagnetic Random Access Memory (FRAM), Read Only Memory (ROM), Programmable Read-Only Memory (PROM), Erasable Programmable Read-Only Memory (EPROM), Electrically Erasable Programmable Read-Only Memory (EEPROM), Flash Memory, magnetic surface memory, optical disk, or Compact Disc Read-Only Memory (CD-ROM) and other memories. It may also be various devices including one or any combination of the above memories.

In some embodiments, the executable instructions may take the form of programs, software, software modules, scripts or codes, be written in any form of programming language, including a compiler or interpreter language, or a declarative or procedural language, and can be deployed in any form, including being deployed as a stand-alone program or as a module, component, subroutine, or other unit suitable for use in a computing environment.

As an example, the executable instructions may, but do not necessarily, correspond to files in the file system, It may be stored as a part of a file holding other programs or data, for example, in one or more scripts stored in a Hyper Text Markup Language (HTML) document, in a single file dedicated to the program in question, or in multiple collaborative files (for example, files storing one or more modules, subroutines, or code portions).

As examples, the executable instructions may be deployed for execution on one computing device, or on multiple computing devices located at one location, or on multiple computing devices distributed at multiple locations and interconnected by a communication network.

It should be noted that "first", "second", etc. are used to distinguish similar objects, and need not be used for describing a specific order or priority.

In addition, the technical schemes described in the embodiments of the present disclosure can be arbitrarily combined without conflict.

The above are only preferred embodiments of the present disclosure and are not intended to limit the scope of protection of the present disclosure.

INDUSTRIAL APPLICABILITY

In the embodiments of the present disclosure, based on the real circuit of a chip, characteristic impedance of a PDN at a specific frequency is determined by measuring changing voltage values output by a to-be-measured output interface of the functional circuit at the specific frequency. In the embodiments of the present disclosure, the characteristic impedance at a specific frequency is acquired based on real circuit measurement, which can relatively truly reflect the frequency domain characteristics of the PDN. It should be emphasized that the PDN in the present disclosure is packaged inside the chip, and the level signal output by the output terminal of the chip is generated and controlled by the PDN itself. The measurement of the present disclosure focus on the frequency domain characteristics of the PDN located inside the memory or other packaged chips.

The invention claimed is:

1. A method for measuring frequency domain characteristics of a Power Delivery Network (PDN) having an output terminal connected to a power supply end of a functional circuit, the method comprising:
   acquiring a to-be-measured output interface of the functional circuit;
   controlling the to-be-measured output interface to output a first level signal having a first preset rule;
   controlling remaining at least one output interface of the functional circuit, other than the to-be-measured output interface, to output a second level signal having a second preset rule according to a first frequency;
   acquiring changing voltage values corresponding to the first frequency and output by the to-be-measured output interface; and
   determining a characteristic impedance of the PDN at the first frequency based on the changing voltage values corresponding to the first frequency;
   wherein the first level signal having the first preset rule represents a level signal whose signal value is constant at a first level; and the second level signal having the second preset rule represents a level signal whose signal value has the first level and a second level with a preset duty ratio,
wherein the first level is greater than the second level.

2. The method of claim 1, wherein a voltage corresponding to the first level is substantially identical to a voltage provided by the PDN to the functional circuit.

3. The method of claim 1, wherein the preset duty ratio is 50%.

4. The method of claim 1, wherein the preset duty ratio comprises a plurality of duty ratios;
wherein acquiring the changing voltage values corresponding to the first frequency and output by the to-be-measured output interface comprises:
acquiring a plurality of groups of changing voltage values corresponding to the first frequency and output by the to-be-measured output interface, wherein each of the plurality of groups of changing voltage values corresponds to a respective one of the plurality of duty ratios; and
wherein determining the characteristic impedance of the PDN at the first frequency based on the changing voltage values corresponding to the first frequency comprises:
determining a plurality of preliminary characteristic impedances of the PDN at the first frequency based on the plurality of groups of changing voltage values corresponding to the first frequency, wherein each preliminary characteristic impedance corresponds to a respective one of the plurality of duty ratios; and
determining an average value of the plurality of preliminary characteristic impedances corresponding to the first frequency as the characteristic impedance of the PDN at the first frequency.

5. The method of claim 1, wherein determining the characteristic impedance of the PDN at the first frequency based on the changing voltage values corresponding to the first frequency comprises:
determining a power supply noise value corresponding to the first frequency based on the changing voltage values corresponding to the first frequency; and
determining the characteristic impedance of the PDN at the first frequency based on the power supply noise value corresponding to the first frequency.

6. The method of claim 5, wherein determining the characteristic impedance of the PDN at the first frequency based on the power supply noise value corresponding to the first frequency comprises:
acquiring a current value corresponding to the first frequency at the remaining at least one output interface; and
determining, a quotient of the power supply noise value corresponding to the first frequency and the current value corresponding to the first frequency, as the characteristic impedance at the first frequency.

7. The method according to claim 1, wherein the first frequency is a certain frequency within a preset frequency range, and the method further comprises:
controlling the remaining at least one output interface to output the second level signal according to each remaining frequency in a set of frequencies other than the first frequency, wherein the set of frequencies comprise a plurality of frequencies within the preset frequency range;
acquiring the changing voltage values corresponding to each remaining frequency output by the to-be-measured output interface; and
determining the characteristic impedance of the PDN at each remaining frequency based on the changing voltage values corresponding to each remaining frequency.

8. The method of claim 7, wherein the preset frequency range comprises at least a range from 10 MHz to 1000 MHz.

9. The method of claim 7, further comprising:
determining a frequency domain characteristic curve of the PDN based on the characteristic impedance of the PDN at the first frequency and the characteristic impedance of the PDN at each remaining frequency.

10. The method of claim 9, further comprising:
acquiring a simulated frequency domain characteristic curve of the PDN obtained by modeling and simulating the PDN; and
verifying an accuracy of the simulated frequency domain characteristic curve based on the simulated frequency domain characteristic curve and the frequency domain characteristic curve.

11. The method of claim 1, wherein the PDN at least comprises a Power Management Integrated Circuit (PMIC), Printed Circuit Board (PCB) power planes, package power planes, and a power processing sub-circuit disposed at the power supply end of the functional circuit.

12. A non-transitory computer-readable storage medium having stored thereon computer programs that, when executed by a processor, cause the processor to implement operations of the method for measuring frequency domain characteristics of a Power Delivery Network (PDN) of claim 1.

13. A device for measuring frequency domain characteristics of a Power Delivery Network (PDN) having an output terminal connected to a power supply end of a functional circuit, the device comprising:
a memory storing processor-executable instructions; and
a processor configured to execute the stored processor-executable instructions to perform an operation of:
acquiring a to-be-measured output interface of the functional circuit;
controlling the to-be-measured output interface to output a first level signal having a first preset rule;
controlling remaining at least one output interface of the functional circuit, other than the to-be-measured output interface, to output a second level signal having a second preset rule according to a first frequency;
acquiring changing voltage values corresponding to the first frequency and output by the to-be-measured output interface; and
determining a characteristic impedance of the PDN at the first frequency based on the changing voltage values corresponding to the first frequency;
wherein the first level signal having the first preset rule represents a level signal whose signal value is constant at a first level; and
the second level signal having the second preset rule represents a level signal whose signal value has the first level and a second level with a preset duty ratio,
wherein the first level is greater than the second level.

14. A system for measuring frequency domain characteristics of a Power Delivery Network (PDN), comprising: a chip, a control circuit, a detection circuit, and an analysis circuit,
wherein the chip comprises the PDN and a functional circuit, an output terminal of the PDN being connected to a power supply end of the functional circuit, and the PDN being configured to supply power to the functional circuit;

the detection circuit is configured to acquire a to-be-measured output interface of the functional circuit;

the control circuit is respectively connected to the PDN and the detection circuit, and configured to control the to-be-measured output interface to output a first level signal having a first preset rule and control remaining at least one output interface of the functional circuit, other than the to-be-measured output interface, to output a second level signal having a second preset rule according to a first frequency;

the detection circuit is connected to the to-be-measured output interface of the functional circuit and the analysis circuit, and configured to detect changing voltage values corresponding to the first frequency and output by the to-be-measured output interface and transmit the changing voltage values corresponding to the first frequency to the analysis circuit; and the analysis circuit is configured to determine a characteristic impedance of the PDN at the first frequency based on the changing voltage values corresponding to the first frequency.

* * * * *